US009070859B1

(12) United States Patent
Clark (10) Patent No.: US 9,070,859 B1
(45) Date of Patent: Jun. 30, 2015

(54) LOW TEMPERATURE DEPOSITION METHOD FOR POLYCRYSTALLINE SILICON MATERIAL FOR A NON-VOLATILE MEMORY DEVICE

(75) Inventor: Mark Harold Clark, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/481,600

(22) Filed: May 25, 2012

(51) Int. Cl.
*H01L 21/20* (2006.01)
*H01L 45/00* (2006.01)

(52) U.S. Cl.
CPC ..................... *H01L 45/08* (2013.01)

(58) Field of Classification Search
CPC .. H01L 45/1253; H01L 45/08; H01L 45/1233
USPC ....................... 438/382, 658; 257/3
See application file for complete search history.

(56) References Cited

U.S. PATENT DOCUMENTS

| 5,707,487 | A | 1/1998 | Hori et al. |
| 6,559,021 | B2 * | 5/2003 | Houghton et al. ............ 438/312 |
| 6,939,787 | B2 | 9/2005 | Ohtake et al. |
| 7,023,093 | B2 | 4/2006 | Canaperi et al. |
| 7,238,607 | B2 | 7/2007 | Dunton et al. |
| 7,474,000 | B2 | 1/2009 | Scheuerlein et al. |
| 7,550,380 | B2 | 6/2009 | Elkins et al. |
| 7,786,589 | B2 | 8/2010 | Matsunaga et al. |
| 7,824,956 | B2 | 11/2010 | Schricker et al. |
| 7,829,875 | B2 | 11/2010 | Scheuerlein |
| 7,858,468 | B2 | 12/2010 | Liu et al. |
| 7,968,419 | B2 | 6/2011 | Li et al. |
| 8,088,688 | B1 * | 1/2012 | Herner ........................... 438/658 |
| 8,097,874 | B2 | 1/2012 | Venkatasamy et al. |
| 8,389,971 | B2 * | 3/2013 | Chen et al. ......................... 257/4 |
| 8,399,307 | B2 | 3/2013 | Herner |
| 2003/0052330 | A1 | 3/2003 | Klein |
| 2004/0192006 | A1 | 9/2004 | Campbell et al. |
| 2004/0194340 | A1 | 10/2004 | Kobayashi |
| 2007/0008773 | A1 | 1/2007 | Scheuerlein |

(Continued)

FOREIGN PATENT DOCUMENTS

KR 10-2011-0014248 A 2/2011

OTHER PUBLICATIONS

Office Action for U.S. Appl. No. 12/814,410, dated Apr. 17, 2012.

(Continued)

*Primary Examiner* — Christine Enad
(74) *Attorney, Agent, or Firm* — Amin, Turocy & Watson, LLP (57) ABSTRACT

A method of forming a non-volatile memory device, includes providing a substrate, forming a first dielectric over the substrate, forming a first wiring structure over the first dielectric, forming a first conductor in contact with the first wiring structure, forming a polycrystalline p+ SiGe material over the first conductor at a deposition temperature ranging from about 350 to about 500 Degrees Celsius, forming a polycrystalline silicon conformally over the SiGe material using the SiGe material as a lattice template at a deposition temperature within about 350 to about 500 Degrees Celsius, the polycrystalline silicon having an intrinsic semiconductor characteristic, forming a second conductor over the polycrystalline silicon in physical and electric contact with the resistive polycrystalline silicon, and forming a second wiring structure over the second conductor.

18 Claims, 8 Drawing Sheets

(56) References Cited

U.S. PATENT DOCUMENTS

| | | | |
|---|---|---|---|
| 2007/0087508 A1 | 4/2007 | Herner | |
| 2007/0105284 A1 | 5/2007 | Herner | |
| 2007/0105390 A1 | 5/2007 | Oh | |
| 2008/0185567 A1 | 8/2008 | Kumar et al. | |
| 2009/0134432 A1 | 5/2009 | Tabata et al. | |
| 2009/0256130 A1 | 10/2009 | Schricker | |
| 2010/0012914 A1 | 1/2010 | Xu et al. | |
| 2010/0019310 A1 | 1/2010 | Sakamoto | |
| 2010/0032640 A1 | 2/2010 | Xu | |
| 2010/0084625 A1 | 4/2010 | Wicker et al. | |
| 2010/0085798 A1 | 4/2010 | Lu et al. | |
| 2010/0090192 A1 | 4/2010 | Goux et al. | |
| 2010/0101290 A1 | 4/2010 | Bertolotto | |
| 2010/0102290 A1 | 4/2010 | Lu et al. | |
| 2010/0157710 A1 | 6/2010 | Lambertson et al. | |
| 2011/0068373 A1 | 3/2011 | Minemura et al. | |
| 2011/0133149 A1 | 6/2011 | Sonehara | |
| 2011/0284814 A1 | 11/2011 | Zhang | |
| 2011/0312151 A1* | 12/2011 | Herner | 438/384 |
| 2012/0001145 A1 | 1/2012 | Magistretti et al. | |
| 2012/0008366 A1 | 1/2012 | Lu | |
| 2012/0012806 A1 | 1/2012 | Herner | |
| 2012/0012808 A1* | 1/2012 | Herner | 257/4 |
| 2012/0015506 A1 | 1/2012 | Jo et al. | |
| 2012/0025161 A1 | 2/2012 | Rathor et al. | |
| 2012/0033479 A1 | 2/2012 | Delucca et al. | |
| 2012/0043621 A1 | 2/2012 | Herner | |
| 2012/0043654 A1 | 2/2012 | Lu et al. | |
| 2012/0074374 A1 | 3/2012 | Jo | |
| 2012/0074507 A1 | 3/2012 | Jo et al. | |
| 2012/0142163 A1 | 6/2012 | Herner | |
| 2012/0220100 A1 | 8/2012 | Herner | |
| 2012/0250183 A1 | 10/2012 | Tamaoka et al. | |
| 2012/0252183 A1 | 10/2012 | Herner | |
| 2013/0020548 A1* | 1/2013 | Clark et al. | 257/3 |
| 2013/0264535 A1 | 10/2013 | Sonehara | |

OTHER PUBLICATIONS

Office Action for U.S. Appl. No. 12/835,699, dated Aug. 24, 2011.
Notice of Allowance for U.S. Appl. No. 12/835,699, dated Feb. 6, 2012.
Office Action for U.S. Appl. No. 12/833,898, dated Apr. 5, 2012.
European Search Report for Application No. EP 1100 5207.3, dated Oct. 12, 2011.
Notice of Allowance for U.S. Appl. No. 12/833,898, dated May 30, 2012.
Notice of Allowance for U.S. Appl. No. 12/939,824, dated May 11, 2012.
Office Action for U.S. Appl. No. 12/913,719, dated Feb. 17, 2011.
Office Action for U.S. Appl. No. 12/913,719, dated Jul. 22, 2011.
Notice of Allowance for U.S. Appl. No. 12/913,719, dated Mar. 12, 2012.
Notice of Allowance for U.S. Appl. No. 12/940,920, dated Oct. 5, 2011.
Office Action for U.S. Appl. No. 13/314,513, dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653, dated Apr. 25, 2012.
International Search Report for PCT/US2011/045124, filed on Jul. 22, 2011.
Written Opinion of the international Searching Authority for PCT/US2011/045124, filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institue of Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, pp. 1-4, National Renewable Energy Laboratory, San Diego, California.
Notice of Allowance for U.S. Appl. No. 12/939,824, dated Jul. 24, 2012.
Office Action for U.S. Appl. No. 13/564,639, dated Mar. 19, 2013.
John S. Suehle et al., "Temperature dependence of soft breakdown and wear-out in Sub-3 nm SiO2 films", 38th Annual International Reliability Physics Symposium, 2000, pp. 33-39, San Jose, California.
Woonki Shin et al., "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036, dated Jul. 9, 2013.
Office Action for U.S. Appl. No. 13/764,698, dated Jul. 11, 2013.
Office Action for U.S. Appl. No. 13/481,600, dated Sep. 20, 2013.
Office Action for U.S. Appl. No. 13/564,639, dated Dec. 6, 2013.
Notice of Allowance for U.S. Appl. No. 13/461,725, dated Nov. 13, 2013.
International Search Report and Written Opinion for PCT/US2013/061244, filed on Sep. 23, 2013.
Notice of Allowance for U.S. Appl. No. 13/468,201, dated Feb. 20, 2014.
Office Action for U.S. Appl. No. 12/625,817, dated Feb. 28, 2014.
Notice of Allowance for U.S. Appl. No. 13/598,550, dated Mar. 20, 2014.
Office Action for U.S. Appl. No. 13/447,036, dated Mar. 21, 2014.
Office Action for U.S. Appl. No. 13/764,698, dated May 21, 2014.

* cited by examiner

LOW TEMPERATURE DEPOSITION METHOD FOR POLYCRYSTALLINE SILICON MATERIAL FOR A NON-VOLATILE MEMORY DEVICE

BACKGROUND

The present invention is directed to resistive switching devices. More particularly, embodiments according to the present invention provide a device structure and a method to form a resistive switching device. The resistive switching device has been applied in non-volatile memory device. But it should be recognized that embodiment according to the present invention can have a much broader range of applicability.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories. However, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance. However, such memory cells are difficult to scale to small sizes. In another example of this, for ORAM devices reliability of such memories is often poor. As yet another example of this, switching of PCRAM devices typically includes Joules heating and undesirably requires high power consumption.

From the above, improved semiconductor memory devices that can scale to smaller dimensions with reduced drawbacks are therefore desirable.

BRIEF SUMMARY OF THE PRESENT INVENTION

The present invention is directed to resistive switching devices. More particularly, embodiments according to the present invention provide a device structure and a method to form a resistive switching device. The resistive switching device has been applied in non-volatile memory device. But it should be recognized that embodiment according to the present invention can have a much broader range of applicability.

In a specific embodiment, a method of forming a resistive switching device for a non-volatile memory device is provided. The method includes providing a substrate having a surface region and forming a first dielectric material overlying the surface region of the substrate. A first wiring structure is formed overlying the first dielectric material and a plug structure is formed in electric contact with the first wiring structure. The first wiring structure can include a first conductive material or a doped semiconductor material depending on the application. The method includes forming a junction material comprising a polycrystalline silicon germanium material having a p+ impurity characteristic overlying the first conductive material. The junction material is deposited at a first deposition temperature of no greater than about 500 Degrees Celsius in a specific embodiment. The method forms a resistive switching material overlying the junction material using the junction material as a template material. The resistive switching material includes a polycrystalline silicon having an intrinsic semiconductor characteristic conformally formed overlying the junction material and deposited at a second deposition temperature no greater than about 500 Degrees Celsius in a specific embodiment. A second conductive material is formed overlying the resistive switching material. The second conductive material is configured to be in physical contact and electric contact with the resistive switching material. A second wiring structure is formed overlying the second conductive material.

In another embodiment, a method of forming a resistive switching device for a non-volatile memory device is provided. The method includes providing a substrate having a surface region and forming a first dielectric material overlying the surface region of the substrate. The method includes forming a first wiring structure overlying the first dielectric material. A plug structure comprising a polycrystalline silicon germanium material having a p+ impurity characteristic is formed in electric contact with the first wiring structure. The polycrystalline silicon germanium material having a p+ impurity characteristic is deposited at a first deposition temperature no greater than about 500 Degrees Celsius in a specific embodiment. In a specific embodiment, a polycrystalline silicon material having a p+ impurity characteristic is conformally formed using the polycrystalline silicon germanium material having a p+ impurity characteristic as a template material. The polycrystalline silicon material having a p+ impurity characteristic is formed at a second deposition temperature no greater than about 500 Degrees Celsius. This low temperature of formation for the p+ polycrystalline silicon material may due to the germanium species on the surface region of the p+ silicon germanium material. A resistive switching material comprising an amorphous silicon material having an intrinsic semiconductor characteristic is formed overlying the polycrystalline silicon material having the p+ impurity characteristic. The method includes forming a second conductive material in physical contact and electric contact with the resistive switching material is formed overlying the resistive switching material. The method subjects the resistive switching material and the second conductive material to a patterning and etching process to form at least a resistive switching element from the resistive switching material. A second wiring structure is formed overlying the second conductive material.

In a specific embodiment, a method of forming a polycrystalline silicon material for fabrication of a resistive switching device is provided. The method includes providing a substrate having a surface region. The method forms a first silicon material overlying the surface region of the substrate at a deposition temperature ranging from about 250 Degrees Celsius to about 450 Degrees Celsius. The first silicon material is an amorphous silicon in a specific embodiment. The first silicon material is characterized by a thickness ranging from about 30 Angstroms to about 120 Angstroms in a specific embodiment. The method includes forming a polycrystalline silicon germanium material having p+ type impurity characteristic overlying the substrate using the first silicon material as a seed material at a first deposition temperature no greater than 500 Degrees Celsius. In a specific embodiment, a polycrystalline silicon material is formed overlying the polycrystalline silicon germanium material having p+ type impurity characteristic using the polycrystalline silicon germanium material having p+ type impurity characteristic as a crystalline lattice template material at a second deposition temperature no greater than about 500 Degrees Celsius.

In a specific embodiment, a resistive switching device for a non-volatile memory device is provided. The device includes a top electrode, a bottom electrode and a resistive switching material configured in an intersection region of the top electrode and the bottom electrode. In a specific embodiment, the top electrode has a portion that includes an active metal material in physical and electric contact with the resistive switching material. The bottom electrode includes a junction material formed from a p+ silicon material (for example, a p+ polycrystalline silicon material, a p+ polycrystalline silicon germanium material, or a combination). The resistive switching material includes a silicon material having an intrinsic semiconductor characteristic. Depending on the embodiment, the resistive switching material can be an amorphous silicon material or a polycrystalline silicon material, each having an intrinsic semiconductor characteristic. The active metal material is configured to form a metal region including a filament structure in a portion of the resistive switching material upon application of an electric field to cause an electric resistance change of the resistive switching material. For example, a positive voltage applied to the top electrode with respect to the bottom electrode would cause the resistive switching device to be in a low resistance state or a high bit state upon programming. A negative voltage applied to the top electrode after programming would cause the resistive switching device to be in a high resistance state or having a low bit value.

Many benefits can be achieved by ways of the present invention over conventional techniques. Embodiments according to the present invention provide a method to form a polycrystalline silicon material at a deposition temperature no greater than about 500 Degrees Celsius. The as deposited polycrystalline silicon material is characterized by a desirable electrical conductivity without an anneal process. The method has been applied to fabrication of a resistive switching device. For example, the polycrystalline silicon material can be p+ doped for a junction material for a resistive switching device using an amorphous silicon material as resistive switching material. In another example, the polycrystalline silicon material can be undoped or having an intrinsic semiconductor characteristic to be used as the resistive switching material. Additionally, the present method can be carried out using conventional processing equipment without modification. Depending on the embodiments, one or more of these benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability.

Switching devices is generally based on a state change characteristic of a non-conducting material in the presence of an electric field. Silicon based switching devices have a material compatibility advantage over other oxide based switching devices in fabrication. However, conventional metal/Si/metal (M/Si/M) type devices require a high operating voltage (usually greater than about 10V) which is not fully controllable and thus reduces the device yield and endurance. Such devices may not be able to further scale down to nanometer scale as required by present application in consumer electronics. To decrease cost per bit, process simplification in addition to device shrinking is necessary. Embodiments according to the present invention provide a low temperature method to form a polycrystalline silicon material and a resulting device structure for a resistive switching device having a desirable switching characteristic and device reliability.

The terms "top" and "bottom" are for purpose of illustration only, and should not be construed to be limiting terms.

Figure 1:
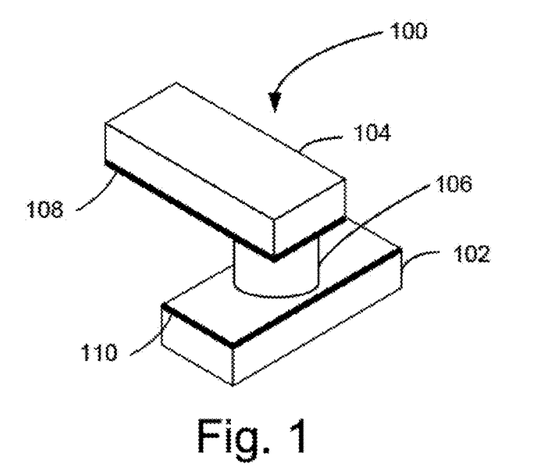
FIG. 1 is a simplified diagram illustrating a resistive switching device according to an embodiment of the present invention.

Referring to FIG. 1, a simplified resistive switching device structure 100 is illustrated. Device 100 includes a first electrode 102, a second electrode 104, and a resistive switching material 106 configured in an intersection region of the first electrode and the second electrode. The second electrode 104 can have a portion that includes an active metal material 108 in a specific embodiment. The active metal material 108 forms a metal region in a portion of the resistive switching material upon application of an electric field. The resistive switching material 106 is characterized by a resistance dependent on amplitude and polarity of the electric filed applied. The metal region further includes a filament structure comprising of one or more metal particles characterized by a length and a first distance between metal particles (e.g. ions) and a second distance between filament structure and the first electrode. The filament structure is allowed to extend or contract depending on an electric field upon application of a potential difference between the first electrode and the second electrode. For proper switching, electrons are allowed to tunnel from the filament structure to the first electrode. A junction material 110 is configured between the switching material and the first electrode to provide a suitable band gap transition between the resistive switching material and the first electrode material.

Resistive switching devices 106 configured in a crossbar structure can be vertically integrated with control CMOS device. The crossbar array of resistive switching device can be formed as a back end of line (BEOL) process, that is, after controlling CMOS have been formed.

Thermal budget for BEOL process is usually limited to the metal interconnects integrity and integrity of the transistors devices formed. For a resistive switching device using silicon material as the resistive switching material 106, the active metal material 108 can include metal material such as silver, gold, palladium, platinum, copper, chromium, nickel, aluminum, and others. The junction material 102 can be a p+ silicon material, for example, p+ polysilicon material in a specific embodiment. P+ polysilicon material is conventionally formed at a deposition temperature of about 650 Degrees. Additionally, p-type impurity species (e.g. Boron) need to be activated at a temperature greater than about 700 Degrees Celsius in an anneal process to have a desirable electrical conductivity. This high temperature is not compatible with current CMOS transistor processing. Accordingly, embodiments according to the present invention provide a method to form a polycrystalline silicon material deposited at a temperature of no greater than about 500 Degrees Celsius, and having the desirable electrical conductivity characteristic.

In a specific embodiment, the method of forming a polycrystalline silicon material at a temperature ranging from about 350 Degrees Celsius to about 500 Degrees Celsius can be summarized in the follow steps:

1. Providing a substrate, the substrate can be a semiconductor substrate having one or more controlling circuitry device formed thereon.

2. Forming a first silicon material overlying the substrate. The silicon material can be formed at a temperature no greater than about 500 Degrees Celsius, for example, between 350 degrees Celsius to about 500 Degrees Celsius, between 380 Degrees Celsius to about 430 Degrees Celsius, or the like. The first silicon material has an amorphous characteristic and can have a thickness ranging from about 30 Angstroms to about 120 Angstroms.

3. Forming a p+ polycrystalline silicon germanium material using the first silicon material as a seed layer material, the polycrystalline silicon germanium material having a p+ impurity characteristic. The polycrystalline silicon germanium material having a p+ impurity characteristic can be formed at a deposition temperature ranging from about 380 Degrees Celsius to about 430 Degrees Celsius. The p+ impurity can be provided by a boron species, an aluminum species, a gallium species, an indium species, and the likes. The p+ impurity species and the germanium species lower the crystalline temperature for the silicon material to a desirable range of no greater than 500 Degrees Celsius.

4. Forming a polycrystalline silicon material overlying the p+ polycrystalline silicon germanium material. The polycrystalline silicon material is formed at a deposition temperature ranging from about 380 Degrees Celsius to about 500 Degrees Celsius free from an anneal process. The polycrystalline silicon material is epitaxially formed overlying the p+ polycrystalline silicon germanium material. The silicon germanium template and surface impurities (for example, the p+ impurity species) of the silicon germanium material lower the crystalline temperature of the polycrystalline silicon material. Depending on the application, the polycrystalline silicon material is not intentionally doped and can have an intrinsic semiconductor characteristic. In other applications, the polycrystalline silicon material can be p+ doped.

The above sequence of steps provides a method of forming a polycrystalline silicon material at temperatures ranging from about 380 Degrees Celsius to about 500 Degrees Celsius, and no greater than about 500 Degrees Celsius. The method has been applied to fabrication of a resistive switching device. For example, the p+ polycrystalline silicon material may be used as a junction material in resistive switching device having a metal-intrinsic silicon-metal (M-I-M) configuration to provide desirable switching characteristics. In other applications, the polycrystalline silicon material having the intrinsic semiconductor characteristic may be used as the resistive switching material. Further details are described throughout the present application and particular below.

Figure 2:
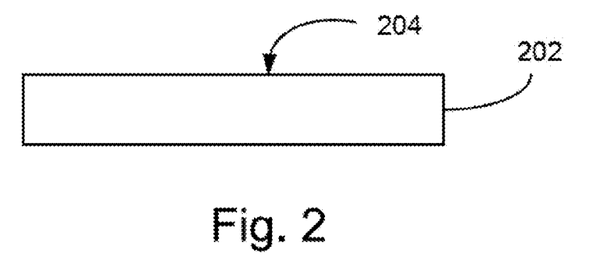
FIGS. 2-14 are simplified diagrams illustrating method of forming a resistive switching device according to an embodiment of the present invention.

FIGS. 2-14 are simplified diagram illustrating a method of forming a resistive switching device for a non-volatile memory device according to an embodiment of the present invention. As shown in FIG. 2, a substrate 202 having a surface region 204 is provided. Substrate 202 can be a single crystal silicon material, a silicon on insulator substrate (commonly known as SOI), or a silicon germanium material, and others, depending on the embodiment. In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 3:
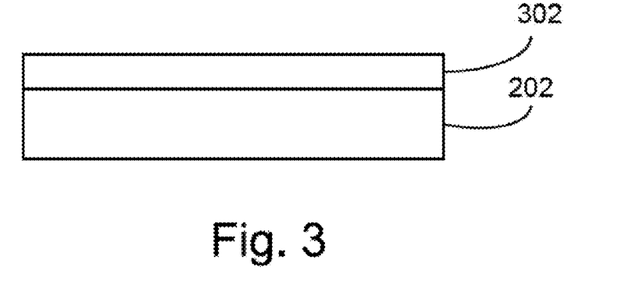

Referring to FIG. 3, the method includes forming a first dielectric material 302 overlying substrate 202. First dielectric material 302 can be silicon oxide, silicon nitride, silicon oxynitride, a high K dielectric, a low K dielectric, or a dielectric stack having alternating layer of silicon oxide and silicon nitride (for example an ONO stack), including any combination of these, and others. First dielectric material 302 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 4:
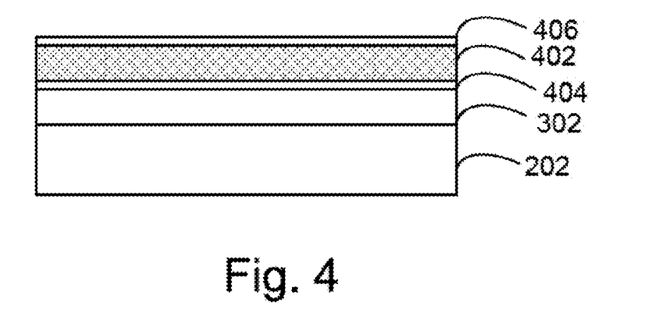

As shown in FIG. 4, the method includes forming a first wiring material 402 overlying first dielectric material 302. First wiring material 402 can be a suitable metal material including alloy materials, or a semiconductor material having a suitable conductivity characteristic. The metal material 402 can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments. In certain embodiments, a first adhesion material 404 is first formed overlying the first dielectric material before deposition of first wiring material 402 to promote adhesion of first wiring material 402 to first dielectric material 302. A diffusion barrier material 406 may also be formed overlying the metal material 402 to prevent the metal material to contaminate other portions of the device in a specific embodiment.

Figure 5:
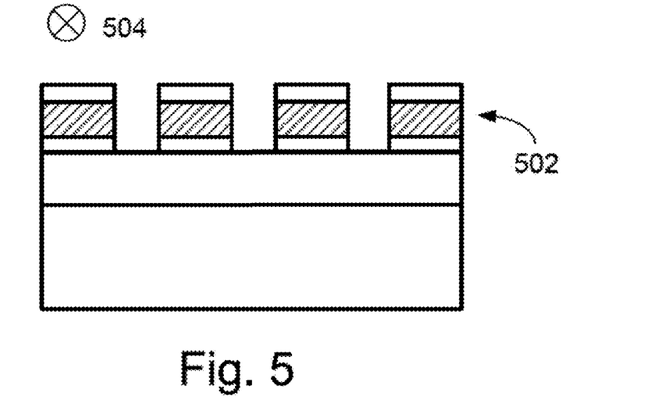

The method subjects first wiring material 402 to a first pattern and etch process to form a first wiring structure 502 in a specific embodiment. As shown in FIG. 5, the first wiring structure includes a plurality of first elongated structures configured to extend in a first direction 504 in a specific embodiment (e.g. in and out of the page).

Figure 6:
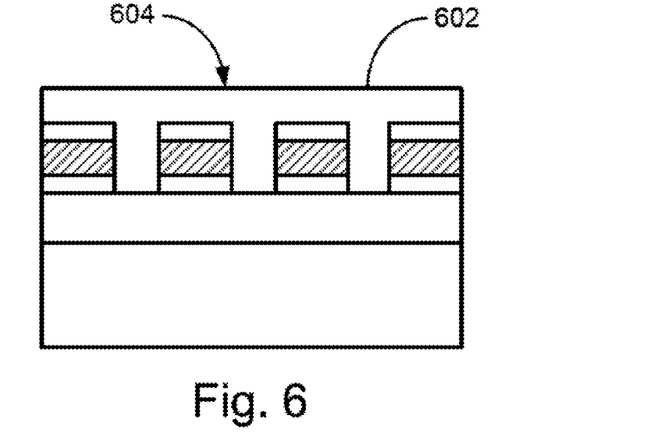

In a specific embodiment, the method deposits a second dielectric material 602 overlying the first wiring structure. The second dielectric material can be silicon oxide, silicon nitride, a dielectric stack of alternating layers of silicon oxide and silicon nitride (for example, an ONO stack), a low K dielectric, a high K dielectric, or a combination, and others, depending on the application. Second dielectric material 602 can be subjected to a planarizing process form a planarized surface 604 as illustrated in FIG. 6. The planarizing process can be a chemical mechanical polishing process, an etch back process, a combination, or others depending on the application. In other embodiments, diffusion barrier material 406 may be optional.

Figure 7:
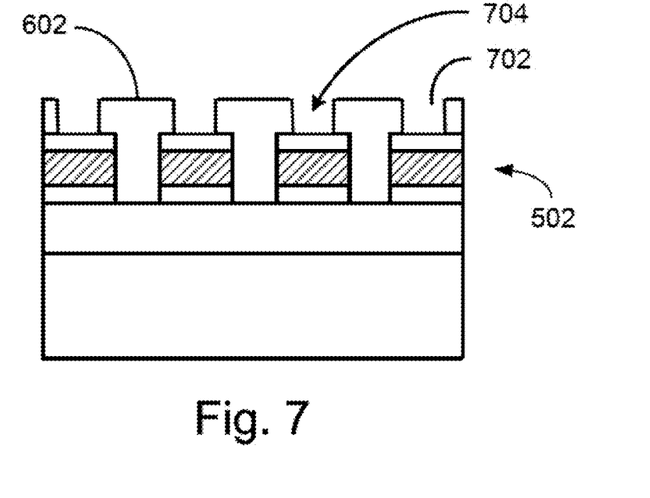

Referring to FIG. 7, the method includes forming openings 702 for a plug structure in portions of the second dielectric material 602 to expose a surface region 704 of the first wiring structure 502 in a specific embodiment. Depending on the embodiment, surface region 704 can be a metal material surface region or a diffusion barrier material surface region. In various embodiments, the opening structure may be formed using a patterning and a dielectric etching process using the metal surface or the diffusion barrier surface as an etch stop.

Figure 8:
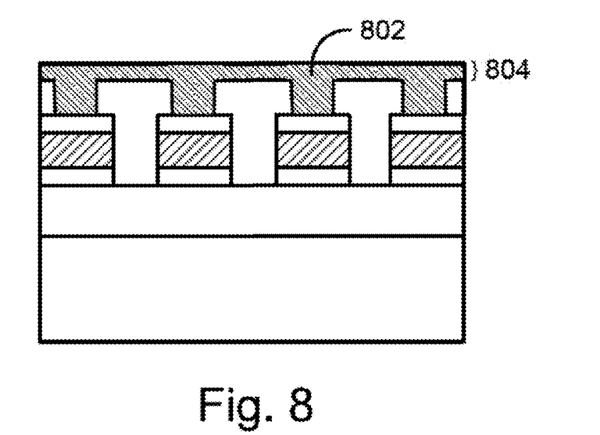

Referring to FIG. 8, the method includes depositing a metal material 802 in opening 702 to form a metal plug structure in a specific embodiment. Metal material 802 can be tungsten, copper, aluminum, a combination and others. Metal material 802 may be deposited using a chemical vapor deposition process, a physical vapor deposition process, an electrochemical process, including electroplating and electroless deposition, or a combination, and others. As shown, metal material 802 includes a thickness 804 overlying second dielectric material 602. In various embodiments thickness 804 can be removed to form a metal plug structure using a chemical mechanical polishing process, an etch back process, and a combination, or others, depending on the specific embodiment.

Figure 9:
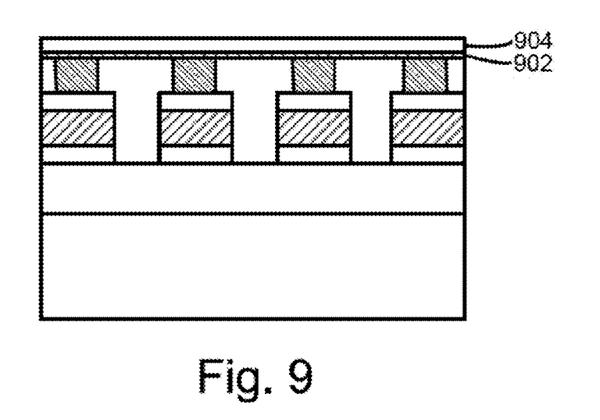

As shown in FIG. 9, the method includes forming a first silicon material 902 overlying the metal plug structure and the exposed surface region of the second dielectric material. The first silicon material 902 can be formed using a deposition process such as a low pressure chemical vapor deposition process a plasma enhanced chemical vapor deposition process using silane ($SiH_4$) or disilane ($Si_2H_6$), or a suitable chlorosilane depending on the application. Alternatively, the first silicon material can be deposited using a physical vapor deposition process from a suitable silicon target. Deposition temperature can range from about 380 Degrees Celsius to about 500 Degrees Celsius, and in certain embodiments deposition temperature can range from about 400 Degrees Celsius to about 440 Degrees Celsius. In a specific embodiment, the first silicon material 902 is deposited using a low pressure chemical vapor deposition process using disilane at a deposition temperature ranging from about 400 Degrees Celsius to about 440 Degrees Celsius. First silicon material 902 is further characterized by a thickness of no greater than about 100 Angstroms and in certain embodiments, no less than about 50 Angstroms. In certain embodiments, the first silicon material 902 may be optional.

Referring again to FIG. 9, embodiments of the present method deposit a junction material 904 overlying the first wiring structure using the first silicon material as a seed layer for junction material 904. Junction material 904 can be a suitable semiconductor material in a specific embodiment. In a specific embodiment, the semiconductor material can be a polycrystalline silicon germanium (poly-SiGe) material. In various embodiments, the polycrystalline silicon germanium material can be doped with a suitable impurity species to obtain a desirable conductivity. In various embodiments, the polycrystalline silicon germanium material can be deposited using a chemical vapor deposition process such as a low pressure chemical vapor deposition process, a plasma enhanced chemical vapor deposition process, atomic layer deposition (ALD) and others. Depending on the application, precursors such as silane and germane in a suitable carrier gas may be used. In various embodiments, the polycrystalline silicon germanium material 904 can have a p+ impurity characteristic.

Depending on the embodiment, the p+ impurity characteristic can be provided using a boron species, an aluminum species or a gallium species and the likes, depending on the application. In a specific embodiment, the p+ impurity species is provided by a boron species co-deposited with silane and germane. The boron species can be provided using diborane in a specific embodiment. Other boron bearing species such as boron trichloride ($BCl_3$), or others, may be also used Ex-situ doping may also be used, depending on the embodiment. Deposition temperature ranges from about 380 Degrees Celsius to about 500 Degrees Celsius and in some cases ranges from about 400 Degrees Celsius to about 440 Degrees Celsius. In other embodiments, the p+ impurity species (for example, the boron species) may be provided by ex-situ doping. In a specific embodiment, the as deposited p+ silicon germanium material 904 has a polycrystalline characteristic without further anneal. In a specific embodiment, the boron doped silicon germanium material has a lower crystalline temperature than an undoped silicon germanium material. In some embodiments, the p+ silicon germanium material is characterized by a sheet resistance of no greater than 0.1 ohm-cm or no greater than about 0.02 ohm-cm, depending on the thickness and the impurity concentration.

Figure 10:
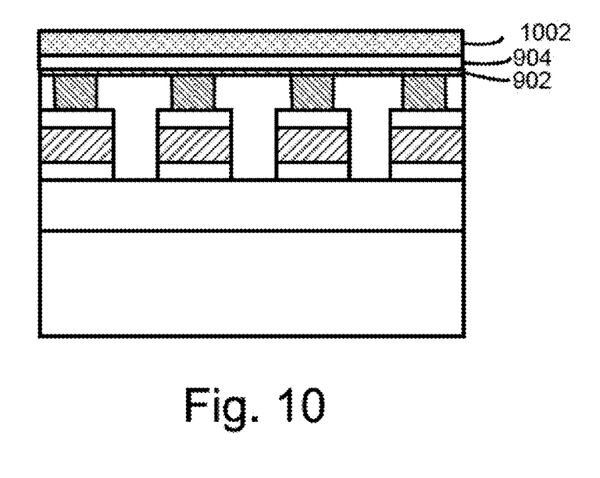

Depending on the embodiment, the method can form a resistive switching material 1002 overlying the junction material 904 as illustrated in FIG. 10. Resistive switching material 1002 can be a polycrystalline silicon material having an intrinsic characteristic. The intrinsic characteristic is achieved by not intentionally doping the polycrystalline silicon material during deposition or after deposition. The polycrystalline silicon material having the intrinsic characteristic may be formed by using silane or disilane as the precursor. Deposition temperature ranges from about 380 Degrees Celsius to about 500 Degrees Celsius and no greater than about 470 Degrees Celsius. The as-deposited polycrystalline silicon material 1002 having the intrinsic semiconductor characteristic is configured to formed conformably and epitaxially overlying the polycrystalline silicon germanium material 904 having the p+ impurity characteristic and has a polycrystalline characteristic free from an anneal step. Alternatively, the resistive switching material can be an intrinsic amorphous silicon material. The intrinsic amorphous silicon material 1002 may be deposited at a lower temperature than that for the polycrystalline silicon material, for example, ranging from about 250 Degrees Celsius to about 450 Degrees Celsius.

Figure 11:
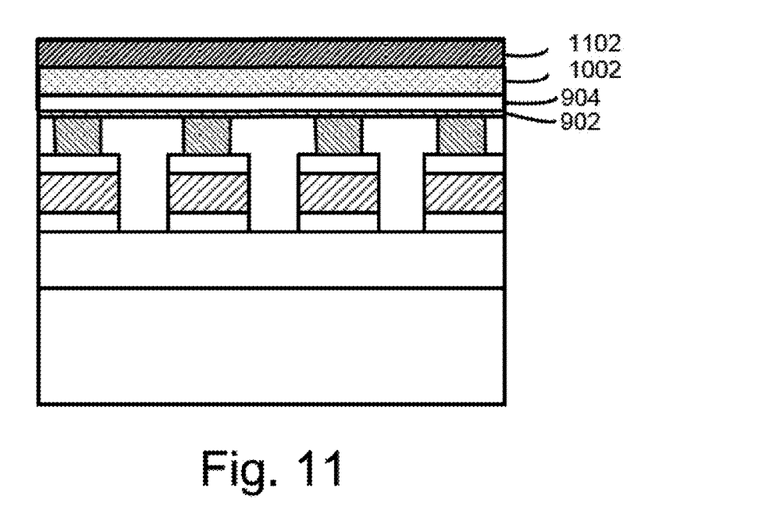

As shown in FIG. 11, the method forms an active conductive material 1102 overlying the resistive switching material 1002. For polycrystalline silicon having the intrinsic characteristic as the resistive switching material, active conductive material 1102 can be a metal material such as silver, gold, platinum, palladium, aluminum, nickel, copper, and others. The active conductive material 1002 is configured to have a suitable diffusivity in the resistive switching material caused by a presence of an electric field in a specific embodiment. The metal material 1102 can be deposited using a chemical vapor deposition process, a physical vapor deposition process, an electrochemical process, including electroplating and electroless deposition, or a combination, and others.

Figure 12:
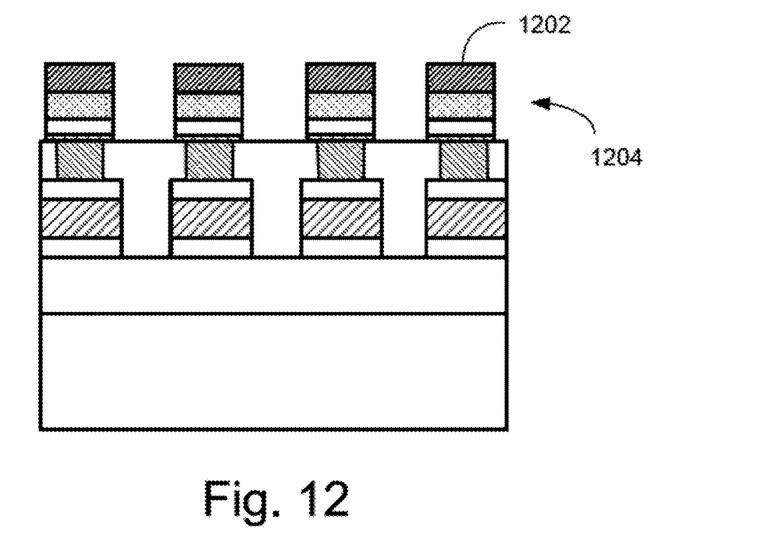

Depending on the embodiment, the method subjects the active conductive material 1102, the resistive switching material 1002, and the junction material 904 including the seed material 902 to a patterning and etching process to form a first structure 1202, as illustrated in FIG. 12. First structure can be a pillar structure in a specific embodiment. The patterning and etching process can use a hard mask as a masking layer in certain embodiment. The hard mask can include a dielectric hard mask, a metal hard mask, and others, depending on the embodiment. First structure 1202 includes resistive switching elements 1204, as shown.

Figure 13:
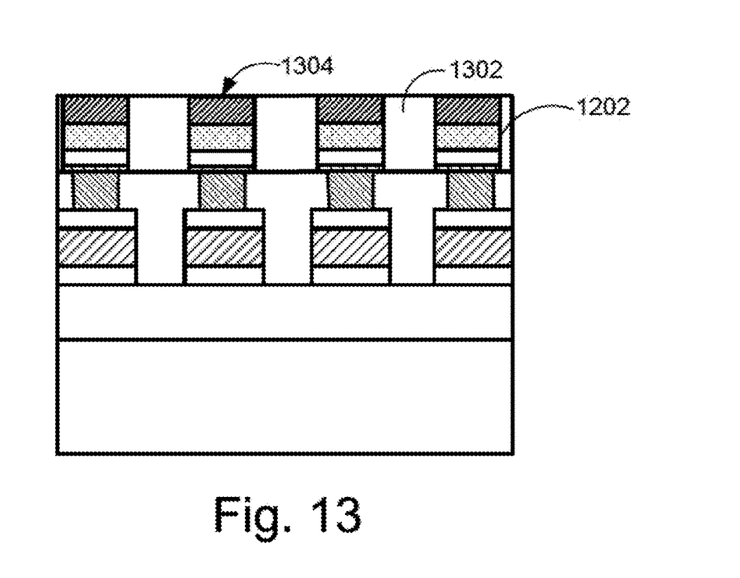

The method forms a dielectric material 1302 overlying first structure 1202 to isolate the first structures 1204 as shown in FIG. 13. Dielectric material 1302 is then subjected to a planarizing process to expose a surface region 1304 of first structure 1202. Surface region 1304 of first structure 1202 can include a surface region of the active conductive material or the metal hard mask material depending on the embodiment.

Figure 14:
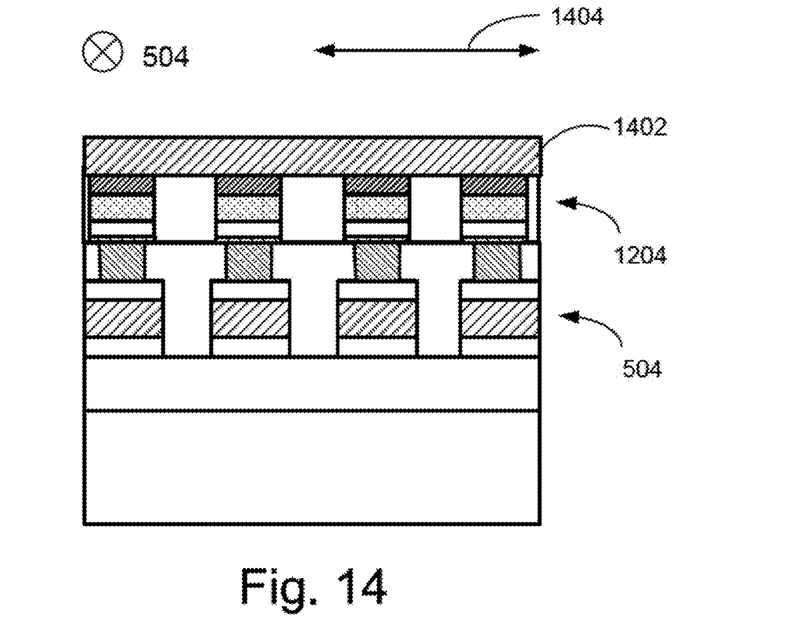

Referring to FIG. 14, a second wiring material 1402 is deposited overlying the surface region 1304 of first structure 1202 and the planarized surface of the dielectric material. Second wiring material 1402 can be tungsten, copper, aluminum, or other suitable interconnect materials. Depending on the embodiment, second wiring material 1402 can include one or more diffusion barrier materials to prevent contamination to other portions of the device. Second wiring material 1402 can also include one or more adhesion material to promote adhesion of second wiring material 1402 to, for example, the second dielectric material surface.

In various embodiments, the second wiring material 1402 is then subjected to a pattern and etch process to form a second wiring structure. The second wiring structure is configured to be elongated in shape to extend in a second direction (e.g. left/right on the page) 1404 orthogonal to the first direction (e.g. in/out of page) 504 of the first wiring structure in a specific embodiment. As shown, the resistive switching element 204 is disposed in an intersection region of the first wiring structure 502 and the second wiring structure 1402.

Figure 8A:
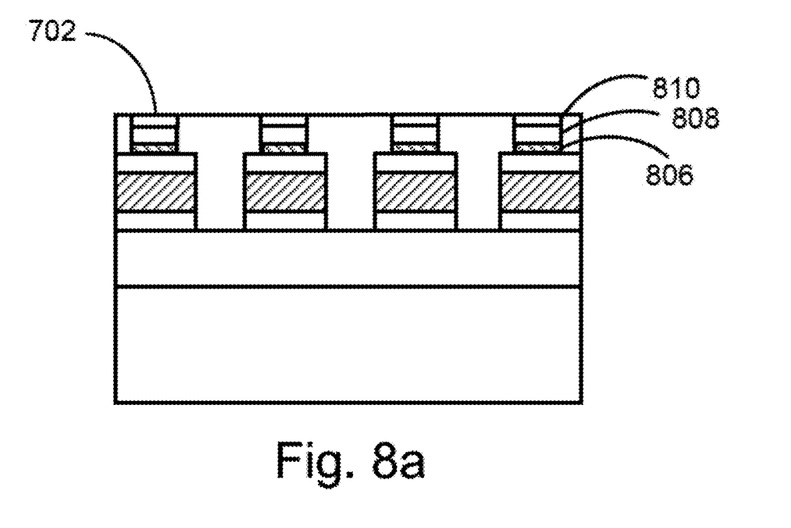
FIGS. 8a, 9a, 10a and 11a are simplified diagram illustrating an alternative method of forming a resistive switching device according to an embodiment of the present invention.

Depending on the embodiment, there can be other variations, for example, opening 702 can be filled using a junction material to form the plug structure. As shown in FIG. 8a, the first silicon material 806 is formed in a portion of opening 702 and the junction material 808 (for example, polycrystalline silicon germanium material having the p+ impurity characteristic) is deposited using the first silicon material 806 as the seed layer. Again depending on the embodiment, a polycrystalline silicon material 810 having a p+ impurity can be formed overlying the polycrystalline silicon germanium material having the p+ impurity characteristic. The polycrystalline silicon material 810 having a p+ impurity can be formed at a deposition temperature ranging from about 350 Degrees Celsius to about 500 Degrees Celsius or from about 400 Degrees Celsius to about 440 Degrees Celsius and no higher than about 450 Degrees Celsius in certain embodiment. In a specific embodiment, the polycrystalline silicon material 810 having the p+ impurity characteristic is configured to form epitaxially overlying the polycrystalline silicon germanium material 808 having the p+ impurity characteristic. The polycrystalline silicon material 810 having a p+ impurity has a desirable crystalline charactristic and electric conductivity as deposited without further anneal and provides desirable switching characteristic in certain applications.

Figure 9A:
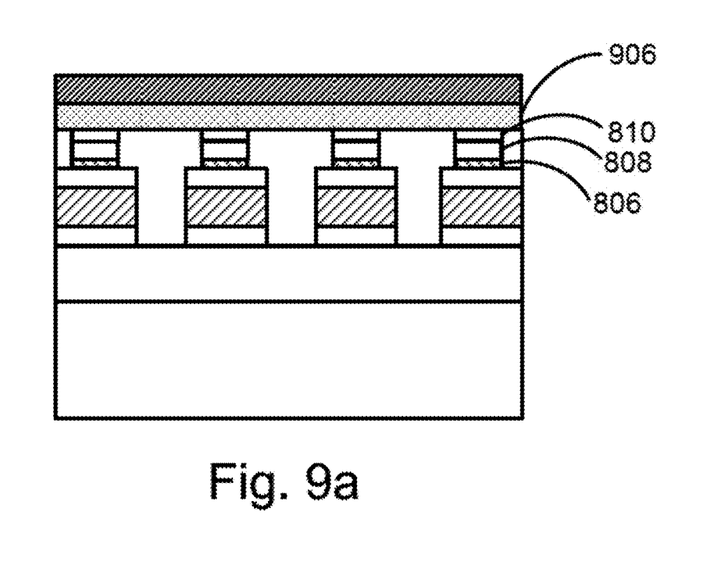

Referring to FIG. 9a, the method forms a resistive switching material 906 overlying the plug structure and the exposed surface region of the second dielectric material. Resistive switching material 906 can be a silicon material having an intrinsic semiconductor characteristic, or is not doped deliberately. Depending on the embodiment, the silicon material 906 having the intrinsic semiconductor characteristic can be polycrystalline or amorphous. Deposition temperature can range from about 250 Degrees Celsius to about 380 Degrees Celsius for amorphous silicon material and about 400 Degrees Celsius to about 440 Degrees Celsius for a polycrystalline silicon material.

Figure 10A:
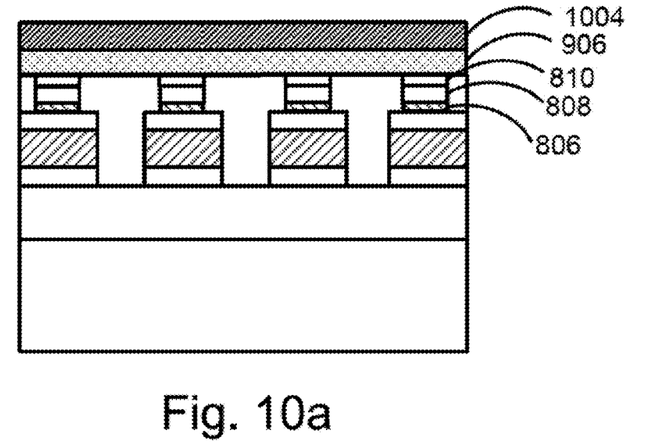

Referring to FIG. 10a, the method includes forming an active conductive material 1004 overlying the resistive switching material. For polycrystalline silicon having the intrinsic characteristic as the resistive switching material, active conductive material 1004 can be a metal material such as silver, gold, platinum, palladium, aluminum, nickel, copper, and others. The active conductive material is configured to have a suitable diffusivity in the resistive switching material caused by a presence of an electric field in a specific embodiment. The metal material can be deposited using a chemical vapor deposition process, a physical vapor deposition process, an electrochemical process, including electroplating and electroless deposition, or a combination, and others.

In some embodiments, the silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

Figure 11A:
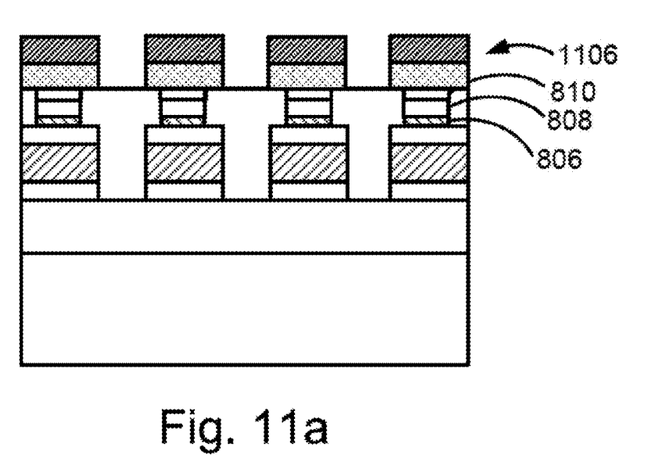

The active conductive material 1004 and the resistive switching material 906 are subjected to a patterning and etching process to form a switching element 1106 from the resistive switching material as shown in FIG. 11*a*. The patterning and etching process can use a hard mask as a masking layer in certain embodiment. The hard mask layer can include a dielectric hard mask, a metal hard mask, and others, depending on the embodiment. The method then proceeds to form the second wiring structure as illustrated in FIGS. 13 and 14.

Figure 15:
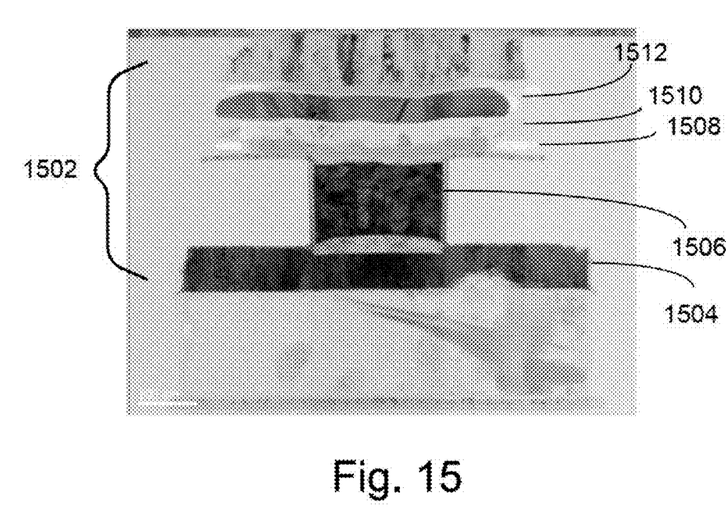
FIG. 15 is a scanning electron microscope image of a resistive switching device according to an embodiment of the present invention.

FIG. 15 is a simplified diagram illustrating a scanning electron micrograph of a resistive switching device 1502 according to an embodiment of the present invention. As shown, resistive switching device 1502 includes a first wiring structure 1504, a metal plug structure 1506, a junction material 1508 comprising a silicon germanium material having a p+ impurity characteristic, a resistive switching material 1510 comprising a polycrystalline silicon material having intrinsic semiconductor characteristic, and an active conductor material 1512 comprising a silver material. Resistive switching material 1510 comprising a polycrystalline silicon material having intrinsic semiconductor characteristic is formed epitaxially overlying the junction material comprising polycrystalline silicon germanium material having p+ impurity characteristic. Resistive switching material 1510 comprising the polycrystalline silicon material having intrinsic semiconductor is deposited using a low pressure chemical deposition process using disilane ($Si_2H_6$) with the following parameters:

Temperature 410 Degrees Celsius.
Pressure 300 mTorr
Time 135 seconds
$Si_2H_6$ 100 SCCM.

As shown in FIG. 15, polycrystalline silicon material having the intrinsic semiconductor characteristic 1510 has a desirable crystalline characteristic for proper switching behavior. Additionally, the polycrystalline silicon material having the intrinsic semiconductor characteristic 1510 is characterized by a desirable crystalline property as deposited without an anneal process.

Figure 16:
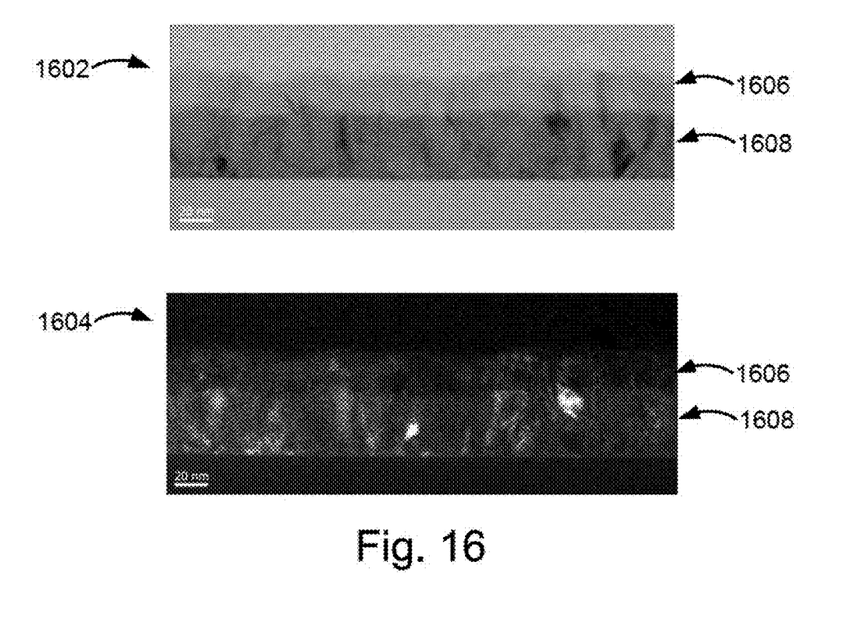
FIG. 16 is a scanning electron microscope image of a junction material for the resistive switching device according to an embodiment of the present invention.

FIG. 16 illustrates scanning electron microscope images 1602 and 1604 of a p+ polycrystalline silicon material 1606 formed overlying a p+ polycrystalline silicon germanium material 1608 according to an embodiment of the present invention. Image 1602 is taken using bright field while image 1604 is taken using dark field. The p+ polycrystalline silicon germanium material and the p+ polycrystalline silicon material are formed using the following deposition parameters:

|  | P+ polycrystalline silicon germanium | P+ polycrystalline silicon. |
|---|---|---|
| Temperature | 425 C. | 425 C. |
| Pressure | 300 mTorr | 300 mTorr. |
| Time | 30 minutes | 10 minutes. |
| $SiH_4$ | 23 sccm | 100 sccm. |
| $GeH_4$ | 10 sccm | — |
| $BCl_3$ | 17 sccm | 80 sccm. |

As shown, p+ polycrystalline silicon material 1606 is epitaxially formed overlying p+ polycrystalline silicon germanium material 1608. In addition, p+ polycrystalline silicon material 1608 has a crystalline characteristic without an anneal process.

In a specific embodiment, a resistive switching device for a non-volatile memory device is provided. The resistive switching device includes a bottom electrode, a top electrode, and a resistive switching material configured in an intersection region of the top electrode and the bottom electrode. The resistive switching material includes an amorphous silicon material having an intrinsic semiconductor characteristic in a specific embodiment. The top electrode includes an active conductive material in electric and physical contact with the resistive switching material. The active conductive material has a diffusivity characteristic in the resistive switching material (for example, the amorphous silicon material) in the presence of an electric field. Depending on the application, the active conductive material can be selected from a group including silver, platinum, gold, palladium, aluminum, and other suitable conductive material. The electric field can be provided by a applying a voltage or an electric current between the top electrode and the bottom electrode. The active conductive material forms an active material region including a filament structure in a portion of the resistive switching material. The applied electric filed causes the filament structure to extend towards the bottom electrode by applying a programming voltage and the resistive switching device is in a lower resistance state. An erase voltage having an polarity opposite to the programming voltage causes the filament structure retract after programming, and the resistive switching device is in a higher resistance state. To improve switching performance of the resistive switching device, a junction material is formed interposing the resistive switching material and the bottom electrode. The junction material can be a p+ polycrystalline silicon material or a p+ polycrystalline silicon germanium material or a combination. The top electrode and the bottom electrode each includes a respective wiring structure to connect the resistive switching device to a controlling circuitry provided on a substrate in certain embodiments. Depending on the embodiment, each of the wiring structures can include a metal material, for example, silver, tungsten, cooper, aluminum, and others. Each of the wiring structures can also be a suitably doped semiconductor material depending on the application.

Representative subject matter disclosed herein includes:

1. A method of forming a polycrystalline silicon material, comprising.

providing a substrate having a surface region;

forming a polycrystalline silicon germanium material having p+ type impurity characteristic overlying the substrate at a first deposition temperature ranging from about 350 Degrees Celsius to 500 Degrees Celsius; and forming a polycrystalline silicon material overlying the polycrystalline silicon germanium material having p+ type impurity characteristic using the polycrystalline silicon germanium material having p+ type impurity characteristic as a template material at a second deposition temperature ranging from about 350 Degrees Celsius to about 500 Degrees Celsius 2. A resistive switching device, comprising:

a top electrode comprising an active metal material;

a bottom electrode; and a resistive switching material comprising a silicon material having an intrinsic semiconductor conductor characteristic configured in an intersection region of the top electrode and the bottom electrode and in physical and electrical contact with the active metal material.

3. The device of claim 2 wherein the bottom electrode comprises a junction material in physical and electric contact with the resistive switching material, the junction comprising a p+ polycrystalline silicon material, a p+ polycrystalline silicon germanium material, or a combination.

4. The device of claim 2 wherein the junction material comprises a p+ polycrystalline silicon material overlying a p+ polycrystalline silicon germanium material, and wherein the p+ polycrystalline silicon material is in contact with the resistive switching material.

5. The device of claim 2 wherein the active metal material comprises silver material, palladium, platinum, gold, nickel, aluminum, an alloy, or a combination.

6. The device of claim 2 wherein the resistive switching material comprises an amorphous silicon material or a polycrystalline silicon material each having an intrinsic semiconductor characteristic.

7. The device of claim 2 wherein the active metal material is characterized by a diffusivity in the resistive switching material and configured to form a metal region comprising a filament structure in a portion of the resistive switching material in a presence of an electric field.

8. The device of claim 2 wherein the filament structure extends in a programming process, the programming process comprises application of a positive voltage to the top electrode with respect to the bottom electrode and retracts in an erase process, the erase process comprises application of a negative voltage to the top electrode with respect to the bottom electrode after programming.

9. The device of claim 2 wherein the junction material is configured to maintain a distance between the filament structure and the bottom electrode.

10. The device of claim 2 wherein the top electrode and the second electrode each further comprises a respective wiring structure providing connection to an external circuitry.

Though the present invention has been exemplified in various embodiments, it is to be understood that the examples and embodiment described herein are for illustrative purpose only purposes only and that various modifications or alternatives in light thereof will be suggested to persons skilled in the art and are to be included within the spirit and purview of this application and scope of the appended claims.

What is claimed is:

1. A method of forming a non-volatile memory device, comprising: providing a substrate having a surface region; forming a first dielectric material overlying the surface region of the substrate; forming a first wiring structure overlying the first dielectric material; forming a structure comprising a first conductive material in electric contact with the first wiring structure; wherein forming the structure comprises: forming a second dielectric material overlying the first wiring structure; forming a via within the second dielectric material exposing a portion of the first wiring structure; and forming the first conductive material within the via;
forming a junction material comprising a polycrystalline silicon germanium material having a p+ impurity characteristic overlying the first conductive material, the junction material being deposited at a first deposition temperature ranging from about 350 Degrees Celsius to about 500 Degrees Celsius; forming a resistive switching material comprising a polycrystalline silicon epitaxially over the junction material using the junction material as a template material at a second deposition temperature ranging from about 350 Degrees Celsius to about 500 Degrees Celsius, the polycrystalline silicon material having an intrinsic semiconductor characteristic, wherein the polycrystalline silicon is epitaxially formed without an anneal process; forming a second conductive material overlying the resistive switching material, the second conductive material being in physical contact and electric contact with the resistive switching material; and forming a second wiring structure overlying the second conductive material.

2. The method of claim 1 wherein the substrate comprises one or more transistor devices formed thereon, the one or more transistor devices coupled to the non-volatile memory device and configured to provide control signals thereto.

3. The method of claim 1 further comprises subjecting the junction material, the resistive switching material, and the second conductive material to a pattern and etch process to form a first structure, the first structure comprises a resistive switching element formed from the resistive switching material.

4. The method of claim 1 wherein the structure comprises a plug structure of a metal material selected from a group consisting of: copper, tungsten, and aluminum.

5. The method of claim 1 wherein forming the junction material further comprises forming a seed layer overlying at least the first conductive material, wherein the seed layer comprises a seed layer for the polycrystalline silicon germanium material.

6. The method of claim 5 wherein the seed layer comprises an amorphous silicon material deposited at a temperature ranging from about 250 Degrees Celsius to about 450 Degrees Celsius and having a thickness ranging from about 40 Angstrom to about 120 Angstroms.

7. The method of claim 1 wherein the second conductive material comprises silver, gold, palladium, aluminum, platinum, copper, zinc, or nickel, or a combination.

8. The method of claim 1 wherein the second conductive material provides metallic ions configured to move within the resistive switching material.

9. The method of claim 1 wherein forming the first conductive material within the via comprises: depositing the first conductive material within the via and on top of the second dielectric material; and removing first conductive material on top of the second dielectric material.

10. The method of claim 9 wherein removing the first conductive material on top of the second dielectric material comprises performing a chemical mechanical polishing process to remove the first conductive material on top of the second dielectric material.

11. A method of forming a non-volatile memory device, comprising: providing a substrate having a surface region; forming a first dielectric material overlying the surface region of the substrate; forming a first wiring structure overlying the first dielectric material; forming a layer of material comprising a polycrystalline silicon germanium material having a p+ impurity characteristic in electric contact with the first wiring structure, the polycrystalline silicon germanium material having a p+ impurity characteristic being deposited at a first deposition temperature ranging from about 350 Degrees Celsius to about 500 Degrees Celsius; forming a polycrystalline silicon material having a p+ impurity characteristic conformally overlying the polycrystalline silicon germanium material having a p+ impurity characteristic at a second deposition temperature ranging from about 350 Degrees Celsius to about 500 Degrees Celsius, wherein the polycrystalline silicon material having the p+ impurity characteristic is epitaxially formed overlying the polycrystalline silicon germanium material having the p+ impurity characteristic substantially-free of an anneal step; forming a resistive switching material comprising an amorphous silicon material having an intrinsic semiconductor characteristic overlying the polycrystalline silicon material having the p+ impurity characteristic, wherein the amorphous silicon material is not intentionally doped; forming a second conductive material overlying the resistive switching material, the second conductive material being in physical contact and electric contact with the resistive switching material, wherein a resistive switching element if formed from the resistive switching material and the second conductive material; and forming a second wiring structure overlying the second conductive material; wherein prior to forming the layer of material comprises: forming a second dielectric material overlying the first wiring structure; forming a via within the second dielectric material exposing a portion of the first wiring structure; and forming a first conductive material within the via; and wherein forming the layer of material comprises forming the layer of material comprising the polycrystalline silicon germanium having the p+ impurity characteristic in contact with the first conductive material within the via.

12. The method of claim 11 wherein the polycrystalline silicon material having the p+ impurity characteristic is epitaxially formed overlying the polycrystalline silicon germanium material having the p+ impurity characteristic.

13. The method of claim 11 wherein the second conductive material comprises a material selected from a group consisting of: silver, gold, palladium, aluminum, platinum, copper, zinc, nickel, or a combination thereof.

14. The method of claim 11 wherein the second conductive material comprises a diffusivity characteristic in the resistive switching material in a presence of an electric field.

15. The method of claim 11 further comprising:

forming a first silicon material above the first wiring structure and before the layer of material comprising the polycrystalline silicon germanium material, wherein the first silicon material comprises an amorphous silicon material characterized by a thickness ranging from about 40 Angstroms to about 120 Angstroms.

16. The method of claim 11 wherein the polycrystalline silicon material has a crystalline characteristic free from an anneal process after forming the polycrystalline silicon material.

17. The method of claim 1 wherein forming the first conductive material within the via comprises: depositing the first conductive material within the via and on top of the second dielectric material; and removing first conductive material on top of the second dielectric material.

18. The method of claim 17 wherein removing the first conductive material on top of the second dielectric material comprises performing a chemical mechanical polishing process to remove the first conductive material on top of the second dielectric material.

* * * * *